(12) United States Patent
Kingsborough et al.

(10) Patent No.: US 7,012,276 B2
(45) Date of Patent: Mar. 14, 2006

(54) ORGANIC THIN FILM ZENER DIODES

(75) Inventors: Richard P. Kingsborough, Acton, MA (US); Igor Sokolik, Boston, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 112 days.

(21) Appl. No.: 10/244,591

(22) Filed: Sep. 17, 2002

(65) Prior Publication Data

US 2004/0051096 A1   Mar. 18, 2004

(51) Int. Cl.
  *H01L 51/20*   (2006.01)
(52) U.S. Cl. .......................... 257/40; 257/603
(58) Field of Classification Search .................. 257/40
  See application file for complete search history.

(56) References Cited

U.S. PATENT DOCUMENTS

| | | | |
|---|---|---|---|
| 3,719,933 A | 3/1973 | Wakabayashi et al. | |
| 3,810,127 A | 5/1974 | Hoff, Jr. | |
| 4,267,558 A | 5/1981 | Guterman | |
| 4,267,583 A | 5/1981 | Suzuki | |
| 4,281,053 A | 7/1981 | Tang | |
| 4,371,883 A | 2/1983 | Potember et al. | |
| 4,616,340 A | 10/1986 | Hayashi et al. | |
| 4,631,562 A | 12/1986 | Avery | |
| 4,652,894 A | 3/1987 | Potember et al. | |
| 4,677,742 A | 7/1987 | Johnson | |
| 4,727,514 A | 2/1988 | Bhuva et al. | |
| 4,733,375 A | 3/1988 | Terashima | |
| 4,834,911 A | 5/1989 | Carew | |
| 4,839,700 A | 6/1989 | Ramesham et al. | |
| 4,860,254 A | 8/1989 | Pott et al. | |
| 5,012,445 A | 4/1991 | Kazuaki et al. | |
| 5,034,192 A | 7/1991 | Wrighton et al. | |
| 5,130,380 A | 7/1992 | Carew | |
| 5,136,212 A | 8/1992 | Eguchi et al. | |
| 5,153,681 A | 10/1992 | Kishimoto et al. | |
| 5,196,912 A | 3/1993 | Matsumoto et al. | |
| 5,206,525 A | 4/1993 | Yamamoto et al. | |
| 5,245,543 A | 9/1993 | Smayling et al. | |
| 5,296,716 A | 3/1994 | Ovshinsky et al. | |
| 5,315,131 A | 5/1994 | Kishimoto et al. | |
| 5,319,564 A | 6/1994 | Smayling et al. | |
| 5,334,539 A * | 8/1994 | Shinar et al. | 438/22 |
| 5,355,235 A | 10/1994 | Nishizawa et al. | |
| 5,392,236 A | 2/1995 | Hashimoto | |
| 5,412,614 A | 5/1995 | Bird | |
| RE34,974 E | 6/1995 | Terashima | |
| 5,431,883 A | 7/1995 | Barraud | |

(Continued)

FOREIGN PATENT DOCUMENTS

DE        196 40 239 A1   4/1998

(Continued)

OTHER PUBLICATIONS

International Search Report, PCT/US03/28026, mailed Jul. 1, 2004.

(Continued)

*Primary Examiner*—Jerome Jackson
(74) *Attorney, Agent, or Firm*—Amin & Turocy, LLP

(57) ABSTRACT

A thin film Zener diode, comprising:
(a) a thin film comprised of at least one layer including at least one organic material; and
(b) first and second electrodes in contact with respective opposite sides of the thin film, wherein the materials of the first and second electrodes and the thickness of the thin film are selected to provide a pre-selected Zener threshhold voltage.

19 Claims, 14 Drawing Sheets

U.S. PATENT DOCUMENTS

| | | | |
|---|---|---|---|
| 5,440,518 A | 8/1995 | Hazani | |
| 5,563,081 A | 10/1996 | Ozawa | |
| 5,572,472 A | 11/1996 | Kearney et al. | |
| 5,579,199 A | 11/1996 | Kawamura et al. | |
| 5,670,818 A | 9/1997 | Forouhi et al. | |
| 5,691,935 A | 11/1997 | Douglass | |
| 5,698,874 A | 12/1997 | Hayashi | |
| 5,734,605 A | 3/1998 | Zhu et al. | |
| 5,761,115 A | 6/1998 | Kozicki et al. | |
| 5,770,885 A | 6/1998 | McCollum et al. | |
| 5,818,749 A | 10/1998 | Harshfield | |
| 5,849,403 A | 12/1998 | Aoki et al. | |
| 5,869,882 A | 2/1999 | Chen et al. | |
| 5,896,312 A | 4/1999 | Kozicki et al. | |
| 5,900,662 A | 5/1999 | Frisina et al. | |
| 5,914,893 A | 6/1999 | Kozicki et al. | |
| 5,998,803 A * | 12/1999 | Forrest et al. | 257/40 |
| 6,055,180 A | 4/2000 | Gudesen et al. | |
| 6,060,338 A | 5/2000 | Tanaka et al. | |
| 6,064,589 A | 5/2000 | Walker | |
| 6,088,319 A | 7/2000 | Gudesen | |
| 6,118,684 A | 9/2000 | Yihong et al. | |
| 6,128,214 A | 10/2000 | Kuekes et al. | |
| 6,150,705 A | 11/2000 | Chen | |
| 6,288,697 B1 | 9/2001 | Eto et al. | |
| 6,292,396 B1 | 9/2001 | Tailliet | |
| 6,326,936 B1 | 12/2001 | Inganas et al. | |
| 6,349,054 B1 | 2/2002 | Hidaka | |
| 6,353,559 B1 | 3/2002 | Hasegawa et al. | |
| 6,384,427 B1 | 5/2002 | Yamazaki et al. | |
| 6,403,396 B1 | 6/2002 | Gudesen et al. | |
| 6,403,397 B1 | 6/2002 | Katz | |
| 6,407,953 B1 | 6/2002 | Cleeves | |
| 6,418,049 B1 | 7/2002 | Kozicki et al. | |
| 6,424,553 B1 | 7/2002 | Berggren et al. | |
| 6,426,891 B1 | 7/2002 | Katori | |
| 6,429,457 B1 | 8/2002 | Berggren et al. | |
| 6,432,739 B1 | 8/2002 | Gudesen et al. | |
| 6,449,184 B1 | 9/2002 | Kato et al. | |
| 6,459,095 B1 | 10/2002 | Heath et al. | |
| 6,461,916 B1 | 10/2002 | Adachi et al. | |
| 6,487,106 B1 | 11/2002 | Kozicki et al. | |
| 2001/0014038 A1 | 8/2001 | Hasegawa et al. | |
| 2001/0054709 A1 | 12/2001 | Heath et al. | |
| 2001/0055384 A1 | 12/2001 | Yamazaki et al. | |
| 2002/0027819 A1 | 3/2002 | Tomanek et al. | |
| 2002/0101763 A1 | 8/2002 | Hosogane et al. | |
| 2002/0104889 A1 | 8/2002 | Forrest et al. | |
| 2002/0125504 A1 | 9/2002 | Perlov et al. | |
| 2002/0134979 A1 | 9/2002 | Yamazaki et al. | |
| 2002/0163030 A1 | 11/2002 | Mandell et al. | |
| 2002/0163057 A1 | 11/2002 | Bulovic et al. | |
| 2002/0163828 A1 | 11/2002 | Krieger et al. | |
| 2002/0163829 A1 | 11/2002 | Bulovic et al. | |
| 2002/0163830 A1 | 11/2002 | Bulovic et al. | |
| 2002/0163831 A1 | 11/2002 | Krieger et al. | |
| 2002/0168820 A1 | 11/2002 | Kozicki et al. | |

FOREIGN PATENT DOCUMENTS

| | | |
|---|---|---|
| DE | 199 59 904 A1 | 6/2001 |
| EP | 0 268 370 A3 | 5/1988 |
| EP | 0 385 688 A2 | 9/1990 |
| EP | 0 727 822 A2 | 8/1996 |
| EP | 1 246 270 A2 | 10/2002 |
| JP | 7-106440 | 4/1995 |
| RU | 2071126 C1 | 12/1996 |
| WO | WO 93/04506 A1 | 3/1993 |
| WO | WO 99/04440 A1 | 1/1999 |
| WO | WO 99/08325 A2 | 2/1999 |
| WO | WO 99/14762 A1 | 3/1999 |
| WO | WO 99/19900 A2 | 4/1999 |
| WO | WO 00/26918 A1 | 5/2000 |
| WO | WO 00/48196 A1 | 8/2000 |
| WO | WO 02/35580 A2 | 5/2002 |
| WO | WO 02/37500 A1 | 5/2002 |
| WO | WO 02/43071 A1 | 5/2002 |
| WO | WO 02/078003 A2 | 10/2002 |
| WO | WO 02/091384 A1 | 11/2002 |
| WO | WO 02/091385 A1 | 11/2002 |
| WO | WO 02/091476 A1 | 11/2002 |
| WO | WO 02/091494 A1 | 11/2002 |
| WO | WO 02/091495 A2 | 11/2002 |
| WO | WO 02/091496 A2 | 11/2002 |
| WO | WO 03/017282 A1 | 2/2003 |

OTHER PUBLICATIONS

A. Arshak, et al., "Gamma Radiation Dosimeter Using the Optical and Electrical Properties of Al/S/CuPc/Al Thin Films", Proc. 23rd International Conference on Microelectronics (MIEL 2002), May 12-15, 2002, pp 349-352, vol. 1, Piscataway, New Jersey.

R. Signerski, et al., "Photoelectric Properties of Heterojunctions Formed From di-(pyriyl)-perylenetetracarboxylic diimide and copper phtalocyanine or pentacene", Synthetic Metals, Apr. 15, 1998, pp 135-137, vol. 94, No. 1, Elsevier, Switzerland.

Rajiv Gupta, et al. "Metal/Semiconductive Polymer Schottky Device", Applied Physics Letters, Jan. 7, 1991, pp 51-52, vol. 58, No. 1, American Institute of Physics, New York.

J.R. Waldrop, et al., "The Mechanism of Schottky-Barrier Formation in Polyacetylene", Applied Physics Letters, Jan. 1, 1981, pp 53-55, vol. 38, No. 1, American Institute of Physics, New York.

Ajit Kumar Mahapatro, et al., "High Rectification in Metal-Phthalocyanine Based Single Layer Devices", IEEE Transactions on Electron Devices, Sep. 2001, pp 1911-1914, vol. 48, No. 9, IEEE Inc., New York.

"A Disrupted Organic Film: Could Memories Be Made of This?," *ORNL Review*, vol. 33, No. 2, 2000.

"Technical Summary of Programmable Metallization Cell Memory Technology," Version 1.3, Dec. 2001.

"The 1998 Conference Archive," *The Sixth Foresight Conference on Molecular Nanotechnology*, Nov. 12-15, 1998, www.foresight.org/Conferences/MNT6/index.html.

Beck, A. et al., "Reproducible Switching Effect in Thin Oxide Films for Memory Applications," *Applied Physics Letters*, vol. 77, No. 1, pp. 139-141, Jul. 3, 2000.

Bernard, Allen, "A Big Name in Chips Helps Coatue in Molecular Memory Race," Aug. 27, 2000, www.nanoelectronicsplanet.com/features/article/0,4028,6571-1452831,00.html.

Chen, J. et al., "Room-temperature Negative Differential Resistance in Nanoscale Molecular Junctions," *Applied Physics Letters*, vol. 77, No. 8, Aug. 21, 2000.

Collier, C. P. et al., "Electrically Configurable Molecular-Based Logic Gates," *Science*, vol. 285, pp. 391-394, Jul. 16, 1999.

Gannon, Andrew, "Toward the Next Generation CD," *Physical Review Focus*, Feb. 16, 2000.

Gao, H. .J. et al., "Reversible, Nanometer-Scale Conductance Transitions in an Organic Complex," *Physical Review Letters*, vol. 84, No. 8, pp. 1780-1783, Feb. 21, 2000.

Gao, H. .J. et al., "Using a New Kind of Organic Complex System of Electrical Bistability for Ultrahigh Density Data Storage," J. Vac. Sci. Technol. B vol. 15, No. 4, pp. 1581-1583, Jul./Aug. 1997.

International Search Report, PCT/RU01/00334, search completed Feb. 14, 2002.
International Search Report, PCT/US02/14236, search completed Aug. 14, 2002.
International Search Report, PCT/US02/14237, search completed Sep. 9, 2002.
International Search Report, PCT/US02/14238, search completed Aug. 9, 2002.
International Search Report, PCT/US02/14239, search completed Aug. 20, 2002.
International Search Report, PCT/US02/14269, search completed Mar. 27, 2003.
International Search Report, PCT/US02/14270, search completed Mar. 28, 2003.
Japanese patent abstract of publication No. 01-103137, Apr. 20, 1989.
Japanese patent abstract of publication No. 01278781, Nov. 9, 1989.
Japanese patent abstract of publication No. 61107723, May 26, 1986.
Japanese patent abstract of publication No. 63293729, Nov. 30, 1998.
Krieger, Ju. H. et al., "Molecular Analogue Memory Cell Based on Electrical Switching and Memory in Molecular Thin Films," *Synthetic Metals*, 7730 (2000), pp. 1-4.
Krieger, Juri H. et al., "Molecular Analogue Memory Cell," *Sixth Foresight Conference on Molecular Nanotechnology*, Santa Clara, California, Nov. 12-15, 1998.
Krieger, Yu. G. et al., "Study of Test Structures of a Molecular Memory Element," *Institute of Inorganic Chemistry*, Siberian Branch, Russian Academy of Sciences. Translated from *Zhurnal Strukturnoi Khimii*, vol. 34, No. 6, pp. 152-156, Nov.-Dec. 1993. Original article submitted Apr. 27, 1993.
Krieger, Yu. G., "Molecular Electronics: Current State and Future Trends," *Journal of Structural Chemistry*, vol. 34, No. 6, pp. 896-904, Nov.-Dec. 1993.
Krieger, Yu. H., "Structural Instability of One-Dimensional Systems as a Physical Principle Underlying the Functioning of Molecular Electronic Devices," *Journal of Structural Chemistry*, vol. 40, No. 4, pp. 594-619, Jul.-Aug. 1999.
Kurita, Ryo et al., "Field Modulation Effects on Charge-Density-Wave Conduction in $NbSe_3$," *Physica B*, 284-288 (2000), pp. 1161-1662.
Ma, L. P. et al., "Data Storage With 0.7 nm Recording Marks on a Crystalline Organic Thin Film by a Scanning Tunneling Microscope," *Applied Physics Letters*, vol. 73, No. 6, pp. 850-852, Aug. 10, 1998.
Ma, L.P. et al., "Nanometer-Scale Recording on an Organic Complex Thin Film With a Scanning Tunneling Microscope," *Applied Physics Letters*, vol. 69, No. 24, pp. 3752-3753, Dec. 9, 1996.
Machida, Yasuhiko et al., "Electrical Switching in Evaporated Lead Phthalocyanine Films," *Japanese Journal of Applied Physics*, vol. 28, No. 2, pp. 297-298, Feb. 1989.
Ovshinsky, Stanford R., "Localized States in the Gap of Amorphous Semiconductors," *Physical Review Letters*, vol. 36, No. 24, pp. 1469-1472, Jun. 14, 1976.
Potember, R. S. et al., "Electrical Switching and Memory Phenomena in Cu-TCNQ Thin Films," *Applied Physics Letters*, vol. 34, No. 6, pp. 405-407, Mar. 15, 1979.
Reed, M.A. et al., "Molecular Random Access Memory Cell," *Applied Physics Letters*, vol. 78, No. 23, pp. 3735-3737, Jun. 4, 2001.
Rossel, C. et al., "Electrical Current Distribution Across a Metal-Insulator-Metal Structure During Bistable Switching," Apr. 24, 2001.
Rotman, David, "Molecular Memory," *Technology Review*, May 2001.
*Semiconductor Times*, pp. 5-6, Jul. 2002.
Stikeman, Alexandra, "Polymer Memory: The Plastic Path to Better Data Storage," *Technology Review*, p. 31, Sep. 2002.
Zhou, C. et al., "Nanoscale Metal/Self-Assembled Monolayer/Metal Heterostructures," *Applied Physics Letters*, vol. 71, No. 5, pp. 611-613, Aug. 4, 1997.

* cited by examiner

← Al (500A)
← PPA (1500A)
← W (1000A)

ORGANIC THIN FILM ZENER DIODES

FIELD OF THE INVENTION

The present invention relates to thin film Zener diodes based upon organic semiconductor materials, and to methods of manufacturing same. The invention has particular utility in the manufacture of Zener diodes with tailored Zener threshold voltages, suitable for use in a variety of electronic device applications, e.g., protection of memory devices.

BACKGROUND OF THE INVENTION

Zener diodes are two-terminal electronic devices which act as conventional diodes when forward-biased, i.e., with unidirectional conduction, but when reverse-biased above a certain threshold voltage, conduct in the reverse direction. The term "Zener diode" is traditionally applied to devices comprised of p-n junctions formed in conventional semiconductor materials, e.g., Si, which junctions undergo avalanche breakdown at reverse bias potentials above about 5 volts, and such devices may be utilized in voltage regulating and circuit protection circuitry.

A current (I) vs. voltage (V) plot of an idealized Zener diode is illustrated in FIG. 1, wherefrom it is evident that, when reverse-biased above a certain voltage, i.e., the Zener threshold voltage ($V_{zt}$), typically above about 5 V for Si-based devices, a sudden rise in the reverse current occurs. Thus, when forward-biased, a Zener diode functions as an ordinary rectifier, but, when reverse-biased, exhibits a knee, or sharp break, in its I-V plot. A characteristic of Zener avalanche or breakdown is that once conduction occurs under reverse-bias, the voltage across the device remains essentially constant upon further increase of reverse current, up to a maximum allowable dissipation rating. As a consequence of this characteristic behavior, Zener diodes find utility, inter alia, as voltage regulators, voltage references, and overvoltage protectors.

Zener diodes may also be utilized for protection of semiconductor memory devices in computer-related applications. However, the difficulty in tailoring ("tuning") the Zener threshold voltage ($V_{zt}$) of conventional Si-based devices, for obtaining optimum protection in such applications, poses a significant problem.

Accordingly, there exists a need for improved Zener diodes and manufacturing methodology therefor, which methodology overcomes the above-described drawback and disadvantage associated with the difficulty in tailoring the Zener threshold voltage of conventional Si semiconductor-based Zener diodes, and which facilitates cost-effective manufacture of Zener diodes having precisely tailored (or "tuned") Zener threshold voltages and other salient operating characteristics and parameters.

DISCLOSURE OF THE INVENTION

An advantage of the present invention is an improved Zener diode.

Another advantage of the present invention is an improved thin film Zener diode.

Yet another advantage of the present invention is an improved thin film Zener diode comprising an organic-based semiconductor thin film.

Still another advantage of the present invention is an improved method of manufacturing a Zener diode.

A further advantage of the present invention is an improved method of manufacturing a thin film Zener diode comprising an organic-based semiconductor thin film.

A still further advantage of the present invention is an improved method of manufacturing a Zener diode with a pre-selected Zener threshold voltage.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are obtained in part by a thin film Zener diode, comprising:

(a) a thin film comprised of at least one layer including at least one organic material; and (b) first and second electrodes in contact with respective opposite sides of the thin film.

According to embodiments of the present invention, the thin film comprises at least one organic material selected from monomers, oligomers, polymers, and combinations thereof; or the thin film comprises metal-containing particles or clusters in an organic polymer matrix or binder.

In accordance with certain embodiments of the present invention, the thin film comprises one or more layers of at least one p-type organic material; and each of the first and second electrodes comprises a material having a high work function for electrons equal to or greater than about 4.1 eV; for example, each of the first and second electrodes comprises at least one electrically conductive material selected from the group consisting of Au, W, Ti, Pt, Ag, Mo, Ta, Cu, metal oxides (e.g., indium-tin oxide, ITO), and organic polymers; and the first and second electrodes may be comprised of the same or different high work function materials.

According to other embodiments of the present invention, the thin film comprises one or more layers of at least one n-type organic material; and each of the first and second electrodes comprises a material having a low work function for electrons less than about 4.1 eV; for example, each of the first and second electrodes comprises at least one electrically conductive material selected from the group consisting of Ca, Mg, Mg combined with another metal, Al, Al alloys, Li—Al alloys, and metal-dielectric combinations, and the first and second electrodes are comprised of the same or different low work function materials.

In accordance with further embodiments of the present invention, the thin film comprises one or more layers of at least one aromatic amine; each of the first and second electrodes comprises at least one electrically conductive material having a high work function for electrons greater than about 4.1 eV; and the thin film comprises a layer of at least one aromatic amine, a layer of at least one aromatic amine and a layer of a different type organic material, or a pair of layers each comprising at least one aromatic amine.

According to embodiments of the present invention, the thickness of the thin film is between about 10 Å and 1 mm, preferably between about 10 Å and 1 $\mu$m, more preferably between about 10 Å and 1,500 Å; and one of the first and second electrodes overlies an electrically insulative substrate.

In accordance with a particular embodiment of the invention, the first electrode is made of Au; the thin film comprises a layer of perylene tetracarboxylic acid dianhydride (PTCDA) overlying the Au first electrode and a layer of copper phthalocyanine (CuPc) over the layer of PTCDA;

and the second electrode overlies the layer of CuPc and is made of Ag; wherein the thin film may further include an additional layer of an organic material between the CuPc layer and the second electrode, e.g., a layer of an arylamine p-type semiconductor such as tetraphenyl biphenylenediamine (TPD).

According to another particular embodiment of the invention, the first electrode is made of Au; the thin film comprises a layer of copper phthalocyanine (CuPc) overlying the Au first electrode, a layer of perylene tetracarboxylic acid dianhydride (PTCDA) over the layer of CuPc, and an additional layer of an organic material over the layer of PTCDA; and the second electrode overlies the additional layer of an organic material and is made of Ag, wherein the additional layer of an organic material is, e.g., a layer of an arylamine p-type semiconductor such as tetraphenyl biphenylenediamine (TPD).

In accordance with still another particular embodiment of the present invention, the first electrode is made of Au; the thin film comprises a layer of copper phthalocyanine (CuPc) overlying the Au first electrode, and a layer of tetraphenyl biphenylenediamine (TPD) over the layer of CuPc; and the second electrode is made of Cu and forms an upper electrode overlying the layer of CuPc.

According to yet another particular embodiment of the present invention, the first electrode is made of Ti; the thin film comprises a layer of copper phthalocyanine (CuPc) overlying the Ti first electrode; and the second electrode overlies the layer of CuPc and is made of Ag.

Still another particular embodiment of the present invention is a structure wherein the first electrode is made of Cu, Ta, Ti, or W; the thin film comprises a layer of polyphenylacetylene (PPA) overlying the Cu or W first electrode; and the second electrode is made of W, Ta, Ti, Al, Ag, or Cu.

Another aspect of the present invention is a method of manufacturing a thin film Zener diode, comprising steps of:
  (a) providing a first electrode;
  (b) forming on the first electrode a thin film comprised of at least one layer including at least one organic material; and
  (c) forming a second electrode on the thin film.

According to various embodiments of the present invention, step (b) comprises forming a thin film comprising at least one organic material selected from monomers, oligomers, polymers, and combinations thereof; or step (b) comprises forming a thin film comprising metal-containing particles or clusters in an organic polymer matrix or binder; and step (b) comprises forming the thin film by a vapor deposition or spin-coating process.

In accordance with a particularly advantageous feature of the present invention, the method further comprises a preliminary step of pre-selecting a Zener threshhold voltage of the diode; and steps (a)–(c) comprise selecting the materials of the first and second electrodes and the thickness of the thin film to obtain the pre-selected Zener threshold voltage.

According to embodiments of the present invention, step (a) comprises providing a first electrode made of a material having a high work function for electrons equal to or greater than about 4.1 eV; step (b) comprises forming a thin film comprising one or more layers of at least one p-type organic material; and step (c) comprises forming a second electrode of a material having a high work function for electrons equal to or greater than about 4.1 eV; illustratively, step (a) comprises providing a first electrode comprising at least one electrically conductive material selected from the group consisting of Au, W, Ti, Pt, Ag, Mo, Ta, Cu, metal oxides, and organic polymers; and step (c) comprises forming a second electrode comprising at least one electrically conductive material selected from the group consisting of Au, W, Ti, Pt, Ag, Mo, Ta, Cu, metal oxides, and organic polymers.

According to alternative embodiments of the invention, steps (a) and (c) respectively comprise providing and forming electrodes comprised of the same or different high work function materials.

In accordance with further embodiments of the present invention, step (a) comprises providing a first electrode made of a material having a low work function for electrons less than about 4.1 eV; step (b) comprises forming a thin film comprising one or more layers of at least one n-type organic material; and step (c) comprises forming a second electrode of a material having a low work function for electrons less than about 4.1 eV; illustratively, step (a) comprises providing a first electrode comprising at least one electrically conductive material selected from the group consisting of Ca, Mg, Mg in combination with another metal, Al, Al alloys, Li—Al alloys, and metal-dielectric combinations; and step (c) comprises forming a second electrode comprising at least one electrically conductive material selected from the group consisting of Ca, Mg, Mg in combination with another metal, Al, Al alloys, Li—Al alloys, and metal-dielectric combinations.

According to alternative embodiments of the invention, steps (a) and (c) respectively comprise providing and forming electrodes comprised of the same or different low work function materials.

In accordance with still other embodiments of the present invention, step (a) comprises providing a first electrode made of a material having a high work function for electrons greater than about 4.1 eV; step (b) comprises forming a thin film comprising one or more layers of at least one aromatic amine; and step (c) comprises forming a second electrode of a material having a high work function for electrons greater than about 4.1 eV; wherein step (b) comprises forming a thin film comprising a layer of at least one aromatic amine, a thin film comprising a layer of at least one aromatic amine and a layer of a different type organic material, or a pair of layers each comprised of at least one aromatic amine; illustratively, step (a) comprises providing a first electrode comprising at least one electrically conductive material selected from the group consisting of Au, W, Ti, Pt, Ag, Mo, Ta, Cu, metal oxides, and organic polymers; and step (c) comprises forming a second electrode comprising at least one electrically conductive material selected from the group consisting of Au, W, Ti, Pt, Ag, Mo, Ta, Cu, metal oxides, and organic polymers.

Alternative embodiments of the invention include those where steps (a) and (c) respectively comprise providing and forming electrodes comprised of the same or different high work function materials.

According to embodiments of the present invention, step (b) comprises forming the thin film to a thickness between about 10 Å and 1 mm, preferably between about 10 Å and 1 µm, more preferably between about 10 Å and 1,500 Å; and step (a) comprises providing the first electrode as a lower electrode formed on an insulative substrate.

In accordance with a particular embodiment of the invention, step (a) comprises providing a first, lower electrode made of Au; step (b) comprises forming a thin film comprising a layer of perylene tetracarboxylic acid dianhydride (PTCDA) overlying the Au lower electrode, and a layer of copper phthalocyanine (CuPc) over the layer of PTCDA; and step (c) comprises forming a layer of Ag as a second, upper electrode overlying the layer of CuPc; wherein step (b) may comprise forming a thin film which further includes an additional layer of an organic material between the CuPc layer and the upper electrode, e.g., a layer of an arylamine p-type semiconductor, such as tetraphenyl biphenylenediamine (TPD).

According to another particular embodiment of the present invention, step (a) comprises providing a first, lower electrode made of Au; step (b) comprises forming a thin film comprising a layer of copper phthalocyanine (CuPc) overlying the Au lower electrode, a layer of perylene tetracarboxylic acid dianhydride (PTCDA) over the layer of CuPc, and an additional layer of an organic material, e.g., a layer of TPD, over the layer of PTCDA; and step (c) comprises forming a layer of Ag as a second, upper electrode overlying the additional layer of organic material.

According to still another particular embodiment of the present invention, step (a) comprises providing a first, lower electrode made of Au; step (b) comprises forming a thin film comprising a layer of copper phthalocyanine (CuPc) overlying the Au lower electrode and a layer of tetraphenyl biphenylenediamine (TPD) over the layer of CuPc; and step (c) comprises forming a layer of Cu as a second, upper electrode overlying the layer of CuPc.

In accordance with yet another particular embodiment of the present invention, step (a) comprises providing a first, lower electrode made of Ti; step (b) comprises forming a thin film comprising a layer of copper phthalocyanine (CuPc) overlying the Ti lower electrode; and step comprises forming a layer of Ag as a second, upper electrode overlying the layer of CuPc.

According to a still further particular embodiment of the invention, step (a) comprises providing a first, lower electrode made of Cu, Ta, Ti, or W; step (b) comprises forming a thin film comprising a layer of polyphenylacetylene (PPA); and step (c) comprises forming a layer of W, Ta, Ti, Al, Ag, or Cu. as a second, upper electrode overlying the layer of PPA.

Embodiments of the present invention include methods wherein step (b) comprises spin coating the thin film of PPA on the first, lower electrode utilizing a solution of the PPA in a suitable solvent, e.g., tetrahydrofuran (THF) and propylene glycol monomethylether acetate (PGMEA).

Additional advantages and aspects of the present invention will become readily apparent to those skilled in the art from the following description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, wherein.

DESCRIPTION OF THE INVENTION

Figure 1:
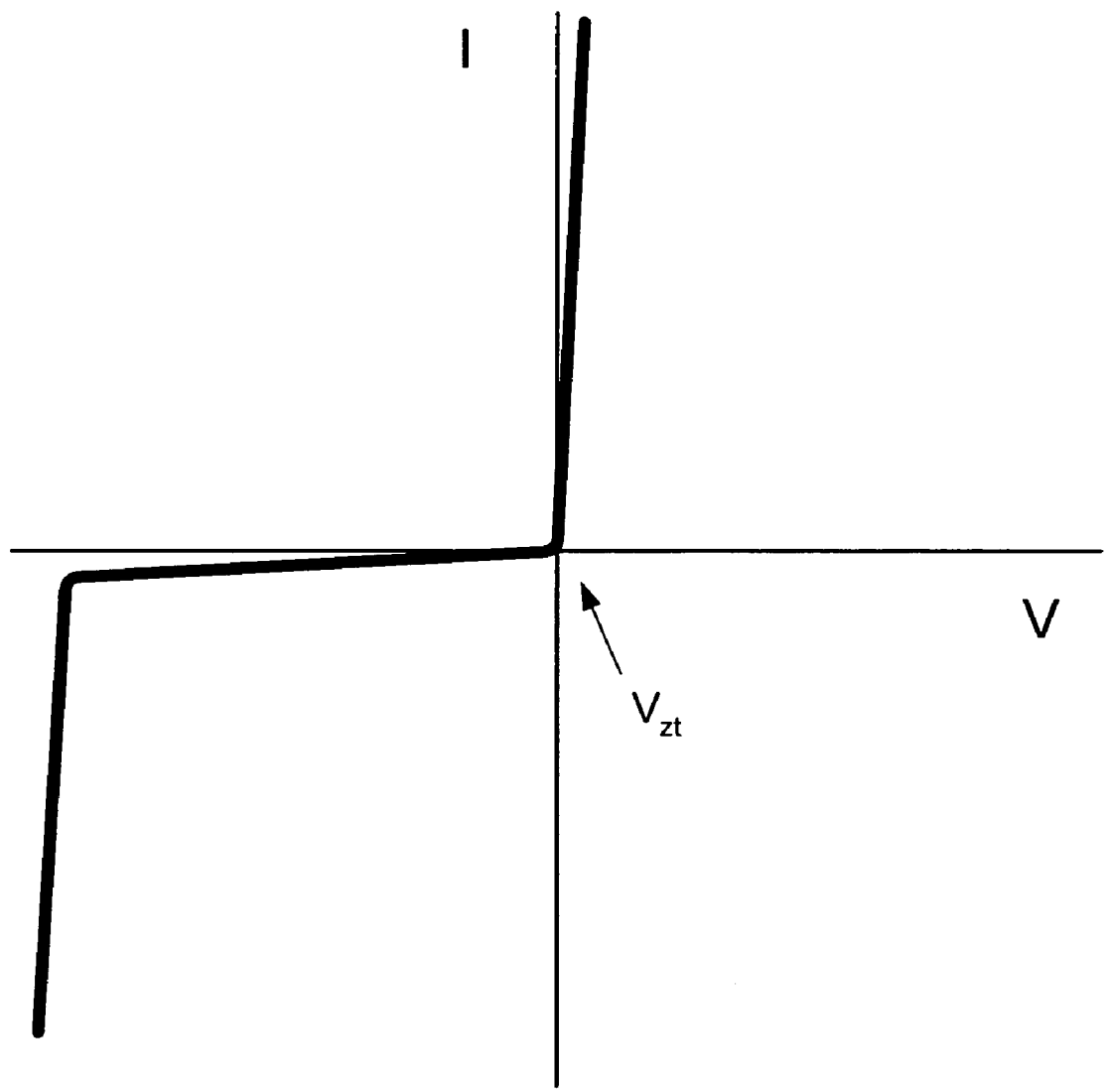
FIG. 1 is an I-V plot of an idealized Zener diode.

The present invention is based upon the discovery by the inventors that two-terminal electronic devices comprised of a thin film including at least one layer including at least one suitable organic semiconductor material sandwiched between a pair of suitable electrical conductors (i.e., electrodes) can: (1) provide operationally satisfactory Zener diode behavior; (2) enable precise tailoring ("tuning") of the Zener threshold voltage ($V_{zr}t$) for use in a particular circuit or application; and (3) be reliably manufactured utilizing known, cost-effective techniques and methodologies.

Organic thin film Zener diodes according to the invention include a thin film comprised of at least one layer including at least one organic material and first and second electrodes in contact with respective opposite sides of the thin film. A variety of organic materials may be utilized for the thin film component, e.g., monomers, oligomers (i.e., dimers, trimers, etc.), polymers, and combinations thereof; or the thin film may comprise metal-containing particles or clusters in an organic polymer matrix or binder.

In accordance with certain embodiments of the present invention, the thin film comprises one or more layers, e.g., a pair of layers, of at least one organic material which functions as a p-type semiconductor (i.e., with hole mobility much greater than electron mobility), and each of the first and second electrodes comprises a material having a high work function for electrons equal to or greater than about 4.1 eV. Illustrative, but non-limitative examples of suitable organic p-type semiconductor materials (i.e., hole transport materials) are: copper phthalocyanine (CuPc), perylenetetracarboxylic acid dianhydride (PTCDA), tetraphenyl biphenylenediamine (TPD), poly(vinylcarbazole) (PVK), and various aromatic means, such as benzidines, starburst amines, and triphenylamines (available from H.W. Sands Corp., Jupiter, Fla.), such as N,N'-Di(naphthalen-1-yl)-N, N'diphenyl-benzidene (α-NPB) or (OPA7534), 4,4',4"-Tris (N,N-diphenylamino)-triphenylamine (TDATA) or (OPA4655), 4,4',4"-Tris(N-(2 -naphthyl)-N-phenylamino) (OPA2290), N,N,N',N'-Tetrakis(3-methylphenyl)-benzidine (OPA 1441), and 4,4',4"-Tris(carbazol-9-yl)-triphenylamine (OPA3370), with the following structural formulae:

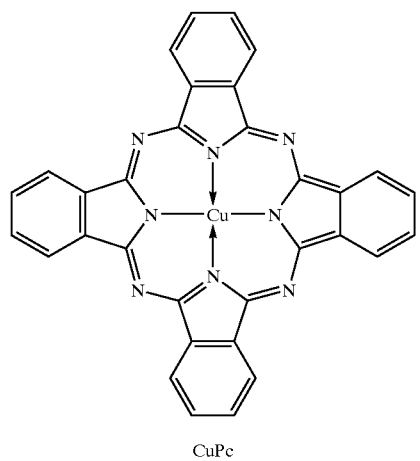

CuPc

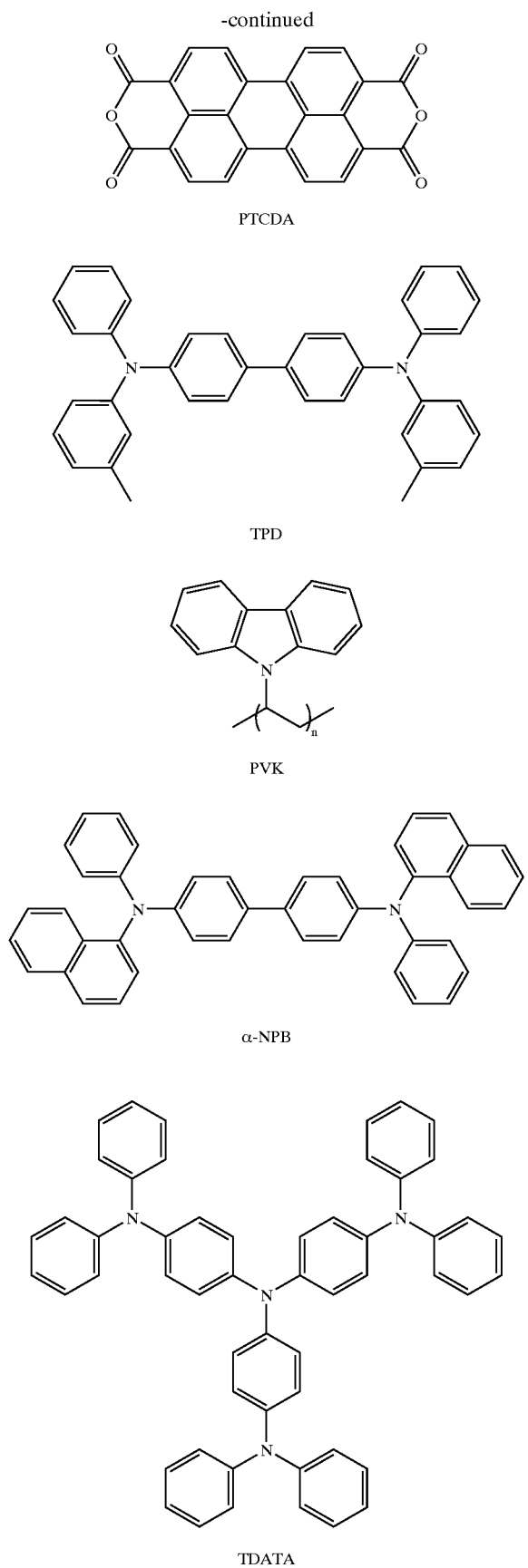
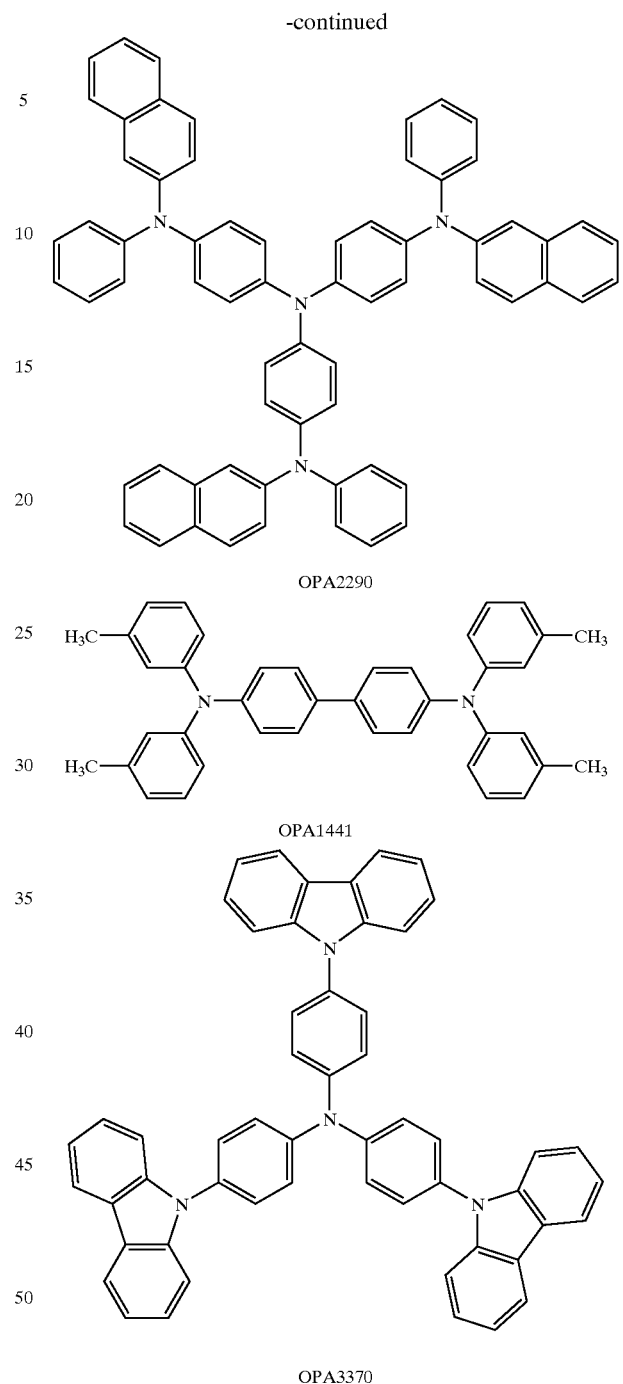

Illustrative, but non-limitative examples of electrically conductive materials with work functions for electrons equal to or greater than about 4.1 eV and suitable for use as each of the first and second electrodes include Au, W, Ti, Pt, Ag, Mo, Ta, Cu, metal oxides, and organic polymers such as polyaniline (PANI), poly (3-4 ethylenedioxythiophene/polystyrene sulfonate (PEDT/PSS), and combinations thereof. The first and second electrodes may be comprised of the same or different high work function materials.

According to other embodiments of the present invention, the thin film comprises one or more layers, e.g., a pair of layers, of at least one organic material which functions as an n-type semiconductor (i.e., with electron mobility much greater than hole mobility), and each of the first and second electrodes comprises a material having a low-work function for electrons less than about 4.1 eV. Illustrative, but non-limitative examples of suitable organic n-type semiconductor materials include quinolines, diazoles, and metal complexes (several being available from H. W. Sands Corp., Jupiter, Fla.), such as, for example, tris(8-hydroxyquinolinato) aluminum (AlQ$_3$) or ORA4487, 2-(4-biphenylyl)-5-phenyl-1,3,4-oxadiazole (PBD), Tris-(5-chloro-8-hydroxyquinolinato)-aluminum (OPA6238), with the following structural formulae:

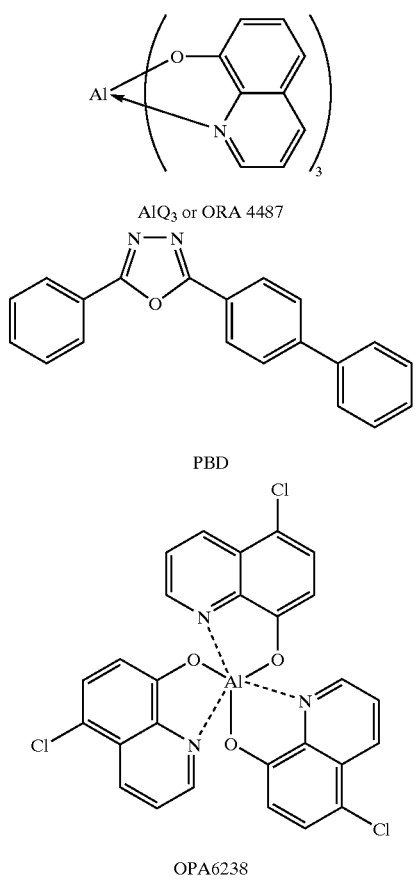

AlQ$_3$ or ORA 4487

PBD

OPA6238

Illustrative, but non-limitative examples of electrically conductive materials with work functions for electrons less than about 4.1 eV and suitable for use as each of the first and second electrodes include Ca, Mg, Mg combined with another metal, Al, Al alloys, Li—Al alloys, and metal-dielectric combinations. As with the p-type organic material-based Zener diodes, the first and second electrodes may be comprised of the same or different low work function materials.

Further embodiments of Zener diodes according to the present invention utilize a thin film which comprises one or more layers, e.g., a pair of layers, of at least one aromatic amine hole transporter (i.e., p-type material); and each of the first and second electrodes comprises at least one electrically conductive material having a high work function for electrons equal to or greater than about 4.1 eV, illustratively, but not limitatively selected from the above-listed group of high work function materials. According to the invention, the thin film may comprise a single layer of at least one aromatic amine, such as, for example, a benzidine, starburst amine, or a triphenylamine; a single layer of at least one such aromatic amine and a layer of a different type organic material; or a pair of layers each comprising at least one such aromatic amine. Illustrative, but non-limitative examples of structural formulae of suitable p-type aromatic amines for use as or as part of the thin film according to the invention are given above, and include TPD, α-NPD, TDATA, and OPA2290.

The thickness of the thin film is, in any of the above-listed embodiments, between about 10 Å and 1 mm, preferably between about 10 Å and 1 μm, more preferably between about 10 Å and 1,500 Å. One of the first and second electrodes is formed on the surface of an electrically insulative substrate, illustratively a Si substrate with a silicon oxide (SiO$_2$) layer thereon.

According to the invention, each of the component layers of the thin film Zener diodes may be readily and cost-effectively formed according to a variety of conventional techniques and methodologies. More specifically, each of the electrodes may be formed by, e.g., a physical vapor deposition (PVD) technique, such as evaporation, vacuum evaporation, sputtering, ion plating, etc., a chemical vapor deposition technique (CVD), such as metal-organic CVD (MOCVD), plasma-enhanced CVD (PECVD), etc., spraying, screen printing, etc., and each of the organic thin film layers may be formed by, e.g., evaporation, vapor or vacuum deposition, spin-coating, etc.

The versatility of the present invention will now be demonstrated by reference to FIGS. 2(A)–2(B) through FIGS. 13(A)–13 (B), which respectively are simplified, schematic cross-sectional views and I-V plots of illustrative, but not limitative, examples of organic thin film Zener diodes according to the invention, wherein the lower electrode is the positive electrode in each instance.

EXAMPLE I

Initial experiments were performed with diodes comprised of about 2,000 Å thick layers of a p-type organic semiconductor (perylenetetracarboxylic acid dianhydride, (PTCDA)) sandwiched between a pair of high work electrodes, i.e., 500 Å thick Au layers as lower electrodes and 1 mm diameter 1,000 Å thick Ag layers as upper electrodes. However, inasmuch as PTCDA tends to crystallize, device performance frequently degraded due to shorting between the lower and upper electrodes. Addition of an about 2,000 Å thick layer of another p-type organic semiconductor (copper phthalocyanine, (CuPc)) intermediate the PTCDA layer and the Ag upper electrode layer (FIG. 2(A)) substantially eliminated shorting between the lower and upper electrodes and resulted in I-V plots exhibiting proper Zener shape or behavior (FIG. 2(B)). Zener threshold voltages ($V_{zt}$) of such devices were relatively high, i.e., >~7 V, attributable to the use of relatively thick organic active layers.

EXAMPLE II

Figure 2A:
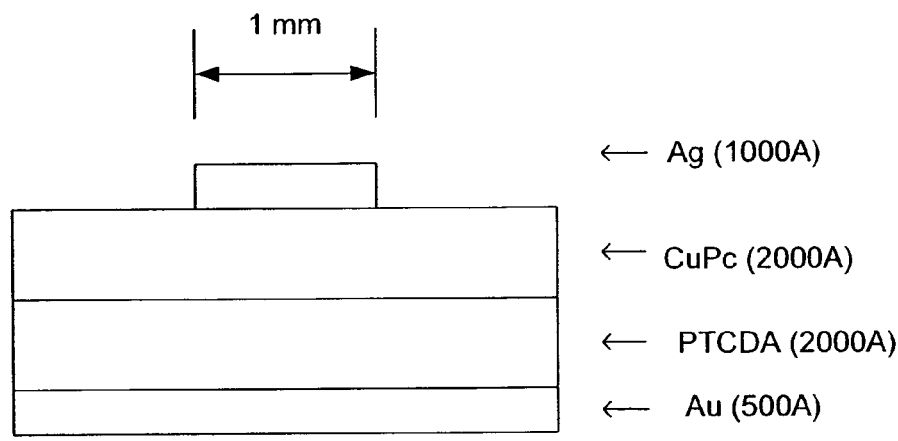
FIGS. 2(A) and 2 (B) through 14 (A) and 14 (B) are simplified, schematic cross-sectional structural views and respective I-V plots of illustrative examples of organic thin film Zener diodes according to the invention.
Figure 2B:
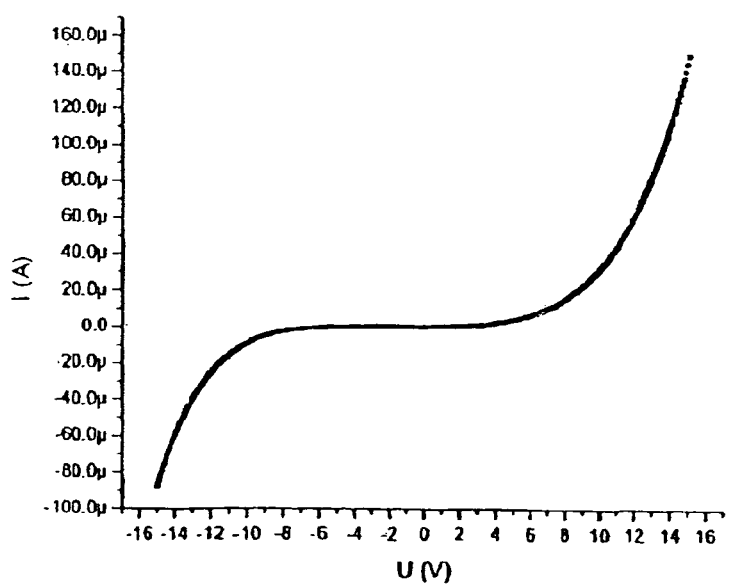
Figure 3A:
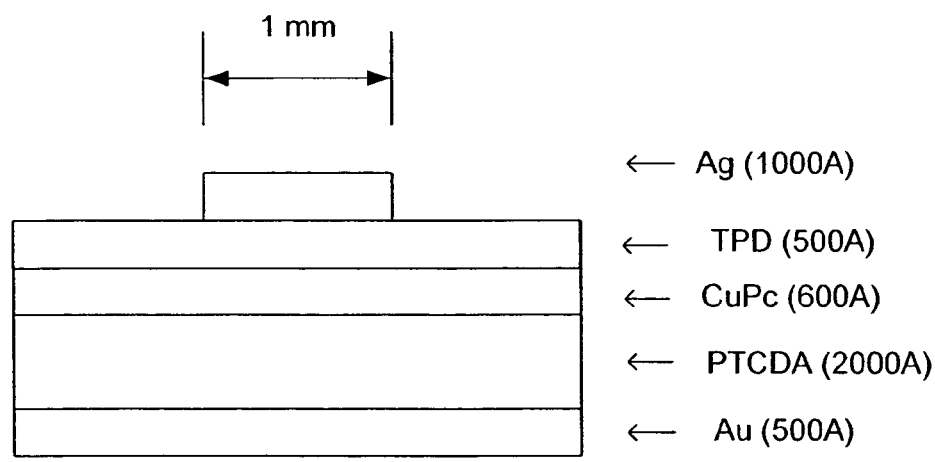
Figure 3B:
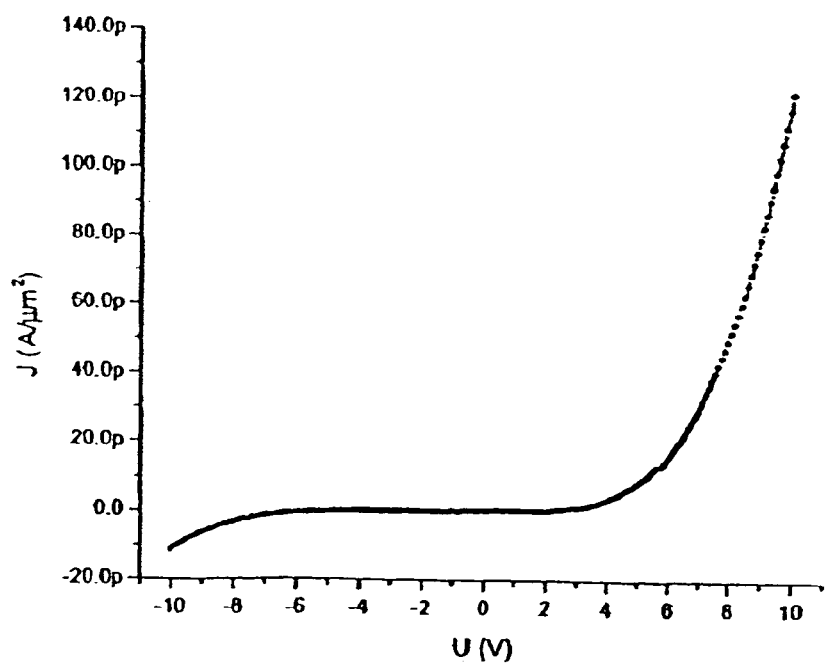
Figure 4A:
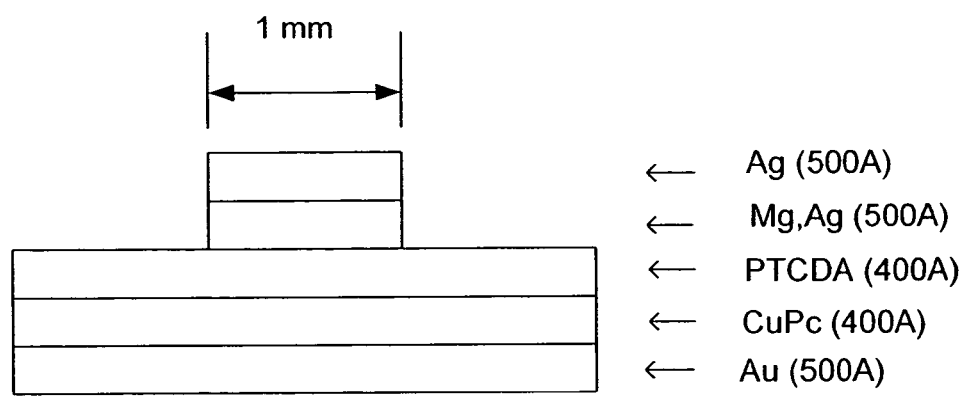
Figure 4B:
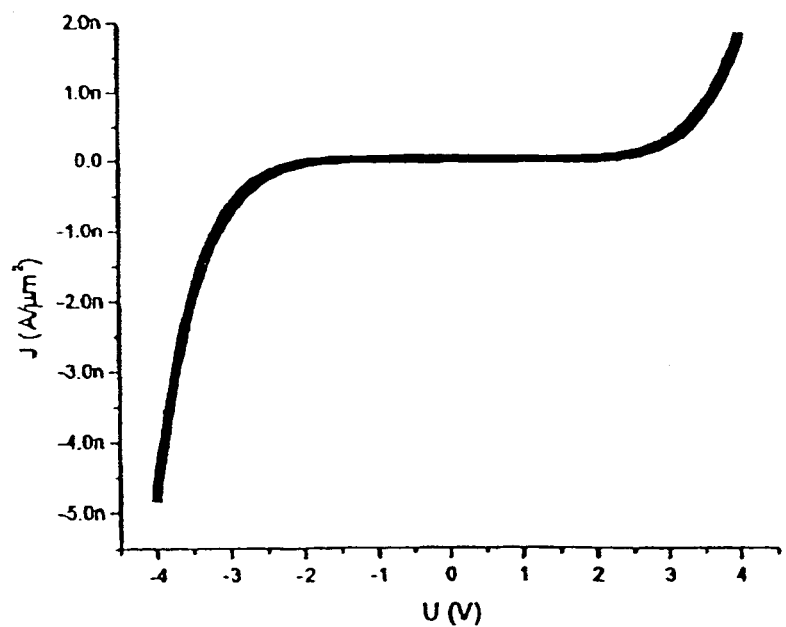
Figure 5A:
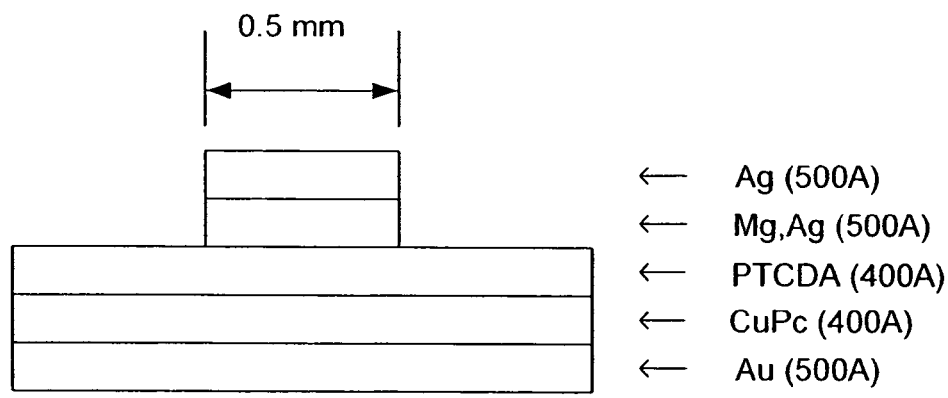
Figure 5B:
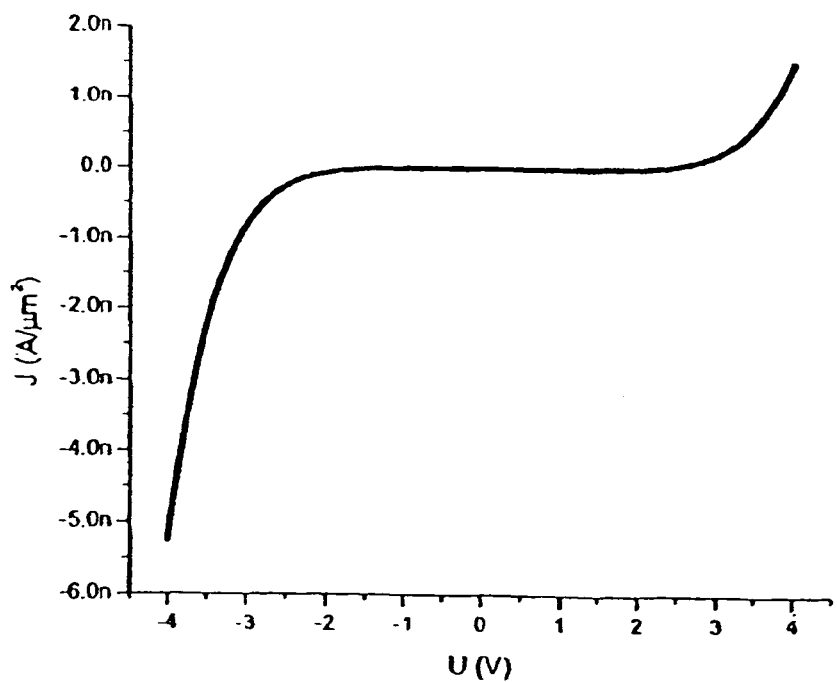
Figure 6A:
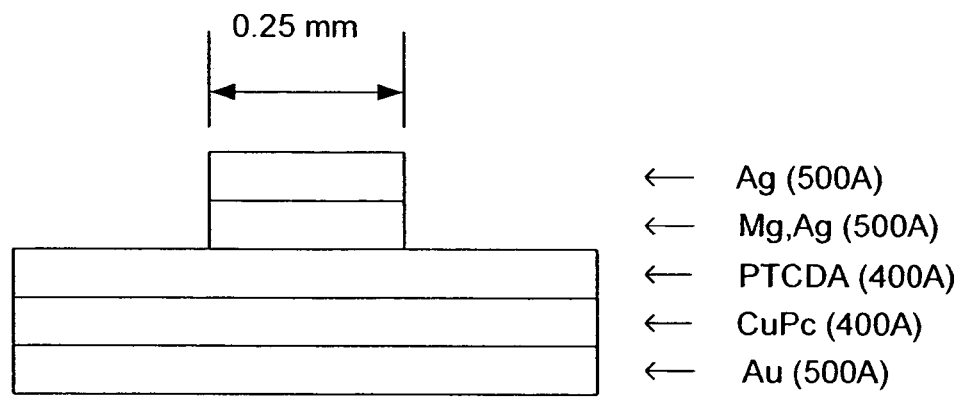
Figure 6B:
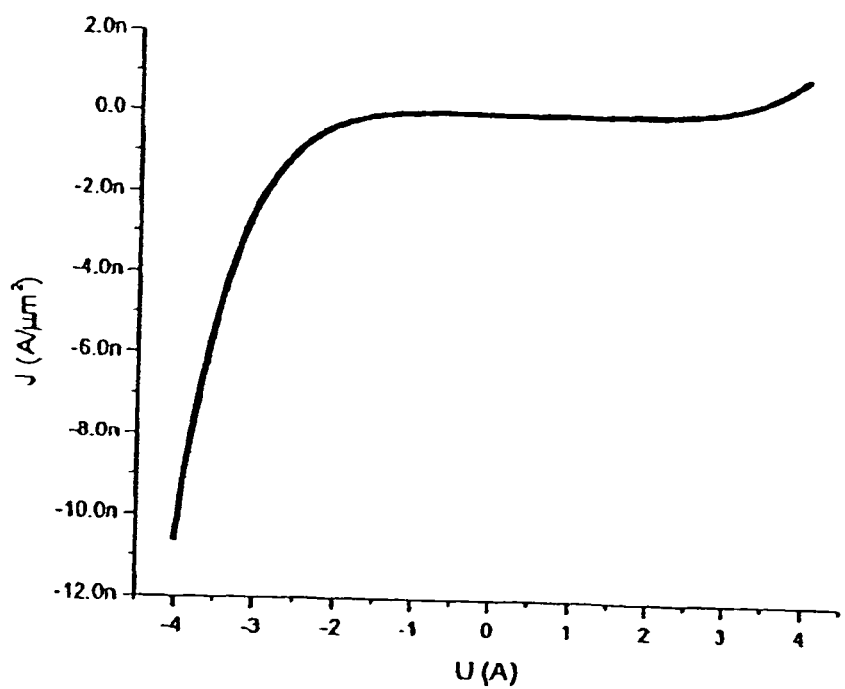

FIG. 3(A) shows, in schematic, simplified cross-sectional view, a diode of similar structure to that of FIG. 2(A), but wherein: (1) the thickness of the CuPc layer of the device of Example I is decreased from about 2,000 Å to about 600 Å; and (2) a layer of an arylamine, i.e., a 500 Å thick layer of tetraphenyl biphenylenediamine, (TPD), is inserted between the CuPc layer and the Ag upper electrode. Comparison of the (I)-(V) plots of FIG. 3(B) with that of FIG. 2(B) indicates that reduction of the CuPc layer thickness and addition of the TPD layer shifted (i.e., lowered) $V_{zt}$ and improved the diode characteristic.

EXAMPLE III

FIGS. 4(A)–6(A) show, in schematic, simplified cross-sectional view, diodes of similar structure to that of FIG. 2(A), but wherein: (1) the thickness of each of the PTCDA and CuPc layers is reduced to about 400 Å; (2) the PTCDA and CuPc layers are inverted, such that the former is adjacent the upper electrode and the latter is adjacent the lower electrode; (3) the upper electrode is formed as a bi-layer structure consisting of a 500 Å thick lower layer of Mg; Ag (9:1 by wt.) in contact with the PTCDA layer and a 500 Å thick upper layer of Ag; and (4) the diameter of the upper electrode is successively decreased (i.e., halved) from about 1 mm to about 0.25 mm. As shown in the respective (I)-(V) plots of FIGS. 4(B)–6(B), each of the devices exhibited similar I-V traces and low Zener threshold voltages $V_{zt} \sim 3.5$ V.

EXAMPLE IV

Figure 7A:
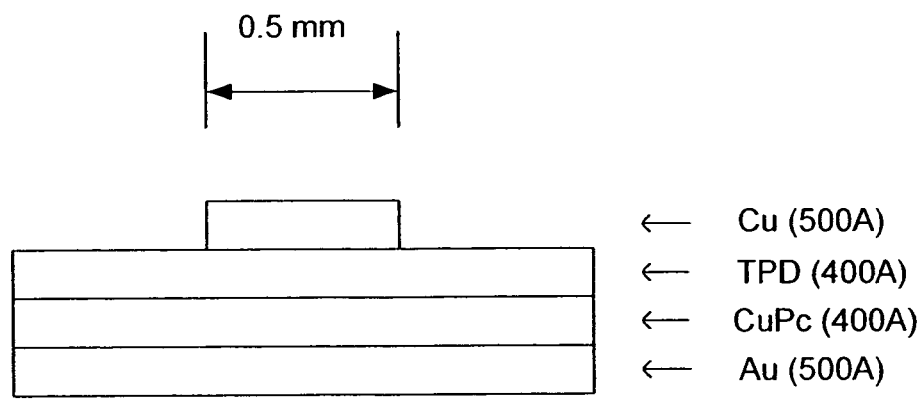
Figure 7B:
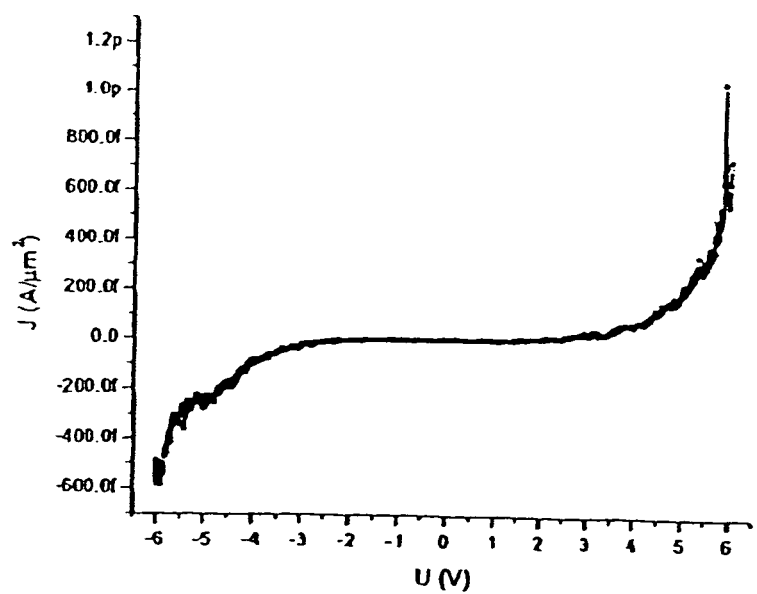

FIG. 7(A) shows, in schematic, simplified cross-sectional view, a diode of similar structure to that of FIGS. 4(A)–6(A), but wherein: (1) the PTCDA layer is replaced with a PTD layer; and (2) the upper electrode is a 500 Å thick layer of Cu. As is evident from the (I)-(V) plot of FIG. 7(B), the resultant diode exhibited symmetric behavior about 0 V and a low Zener threshold voltage $V_{zt} \sim 4.5$ V.

EXAMPLE V

Figure 8A:
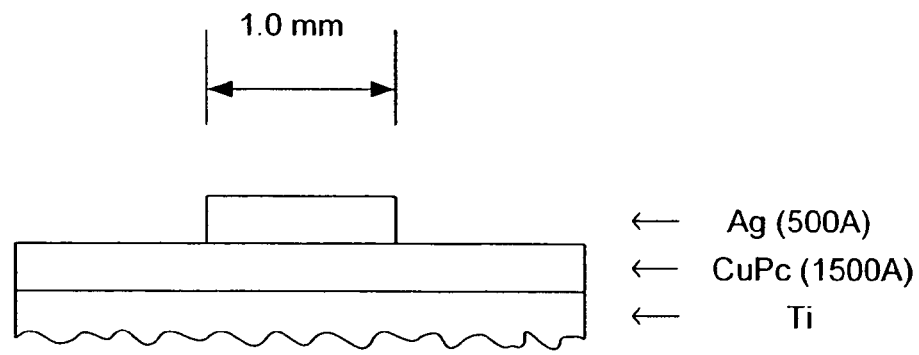
Figure 8B:
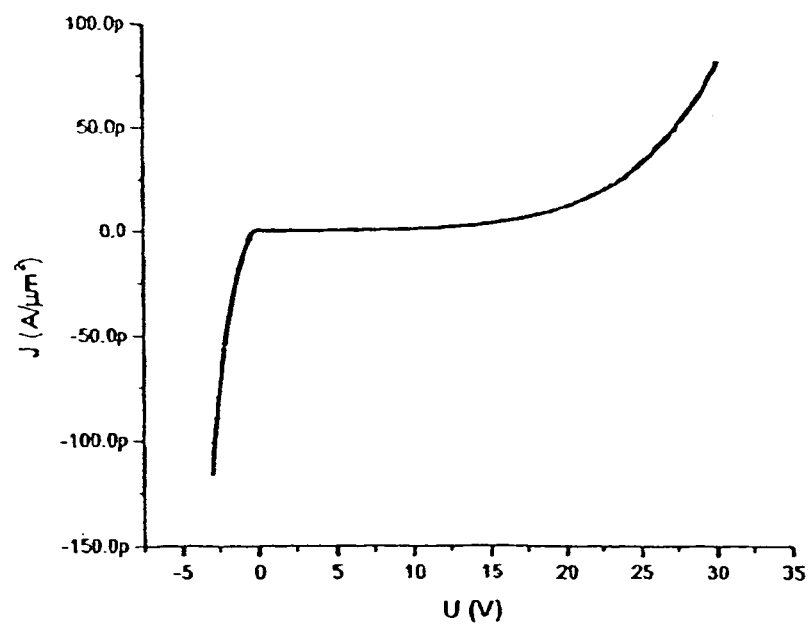
Figure 9A:
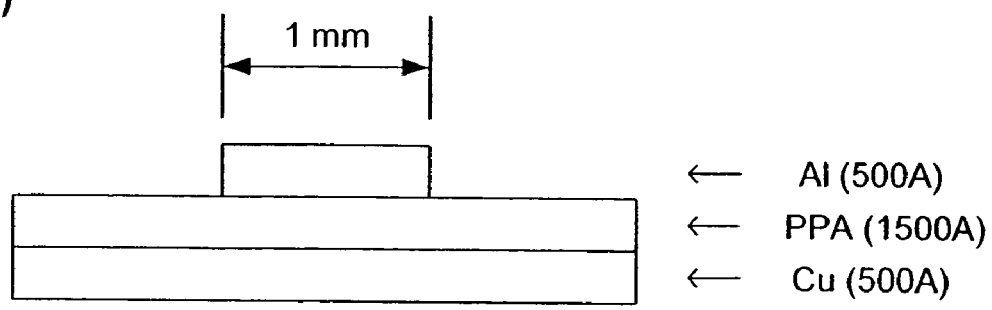
Figure 9B:
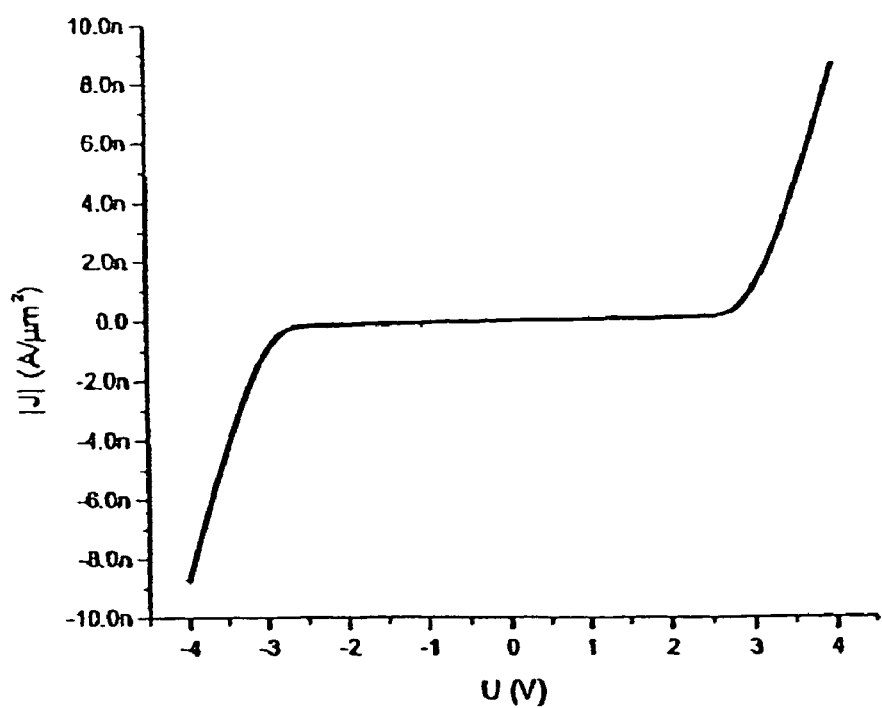
Figure 10A:
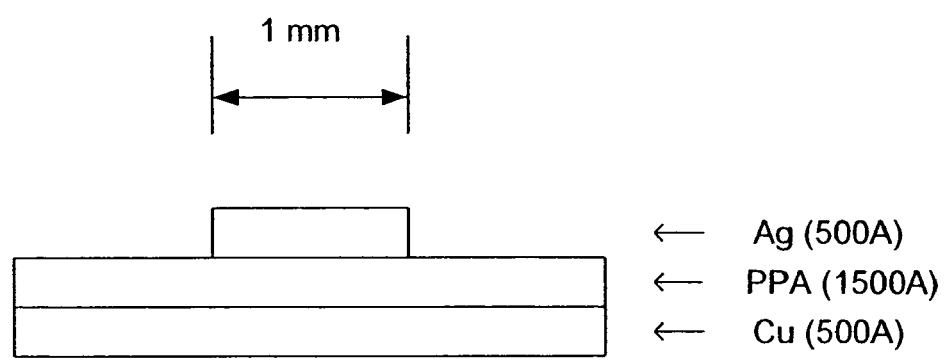
Figure 10B:
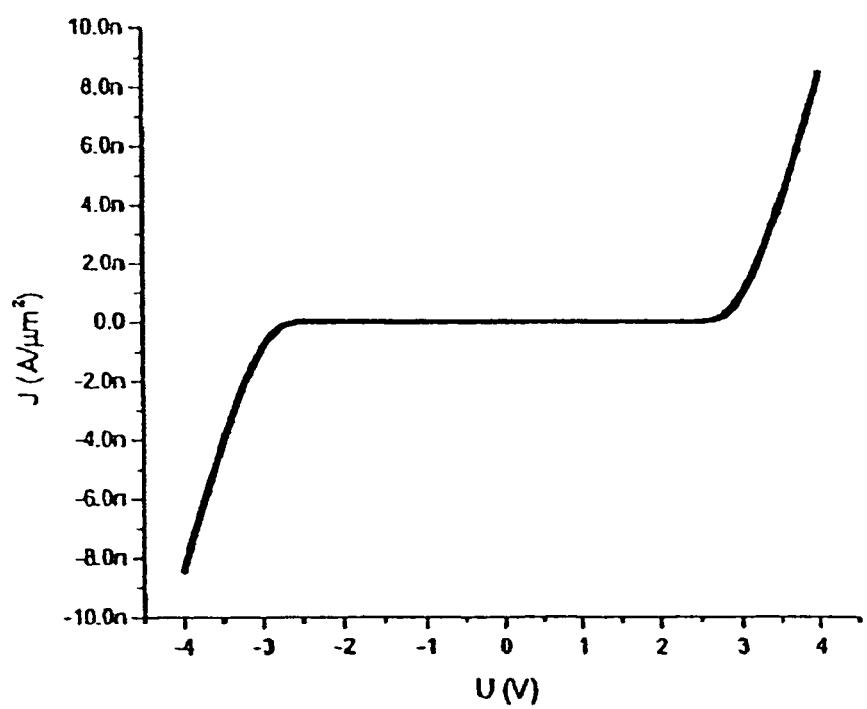
Figure 11A:
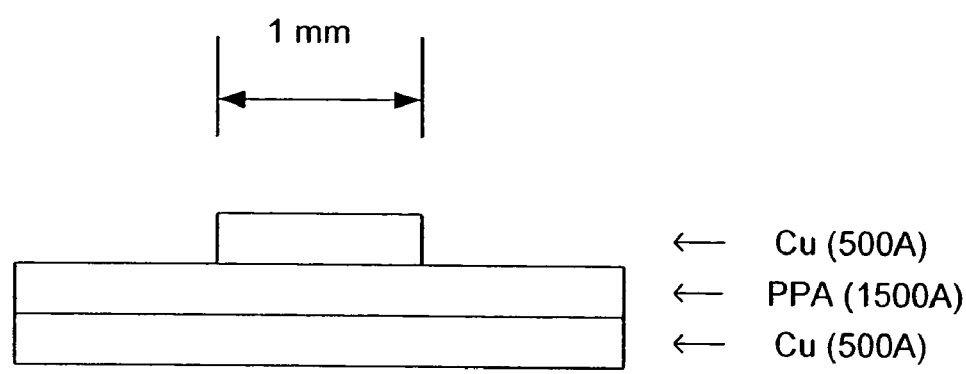
Figure 11B:
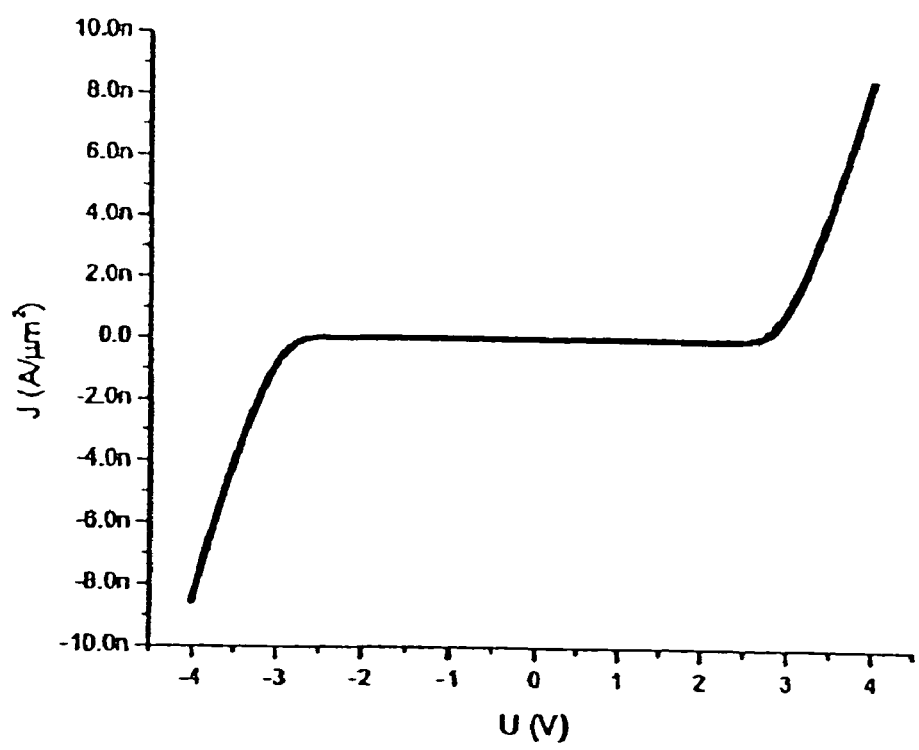
Figure 12A:
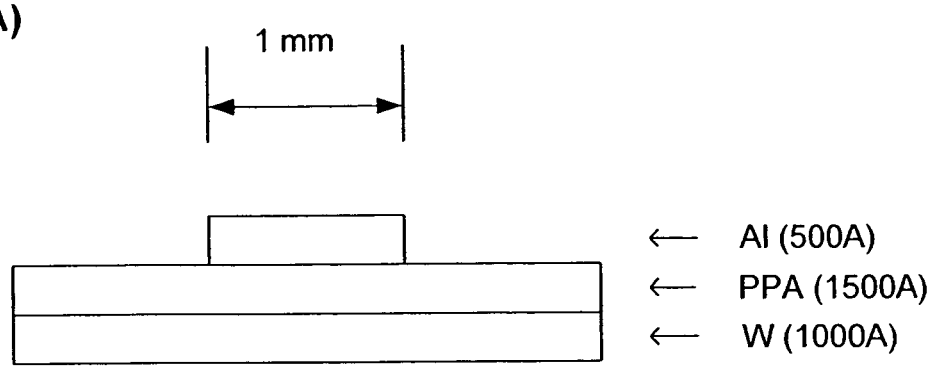
Figure 12B:
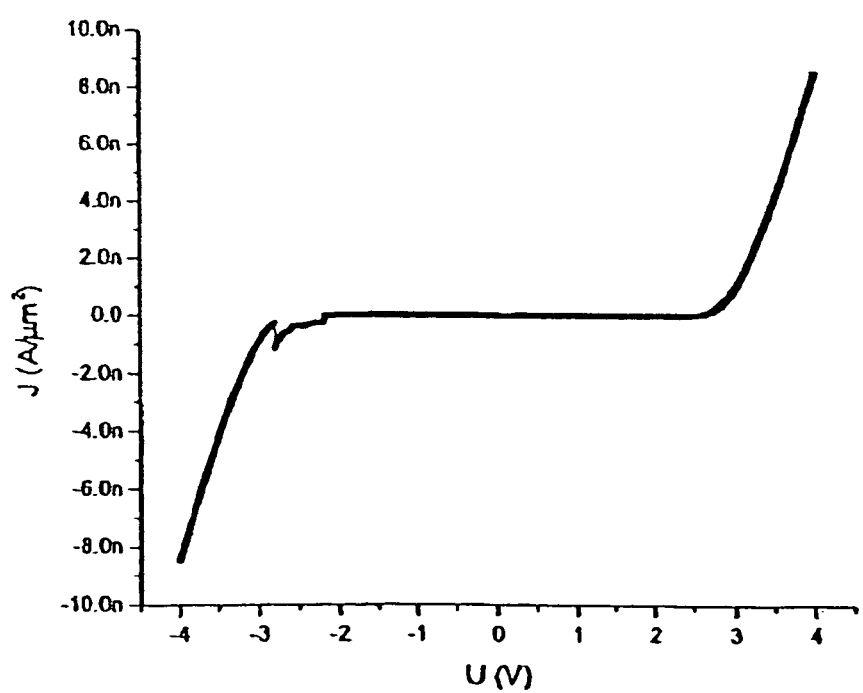
Figure 13A:
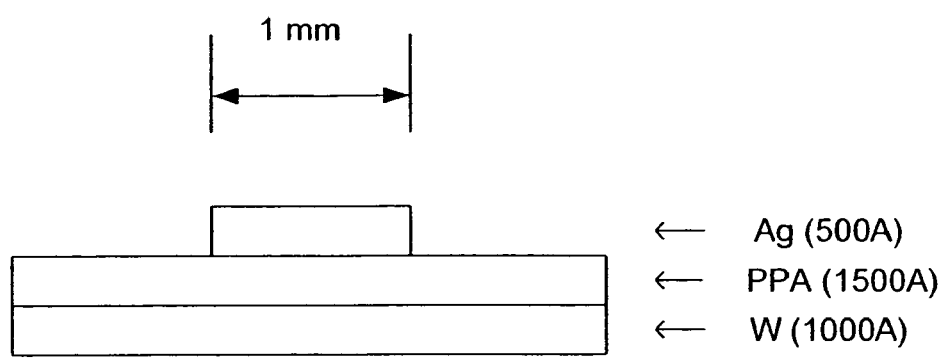
Figure 13B:
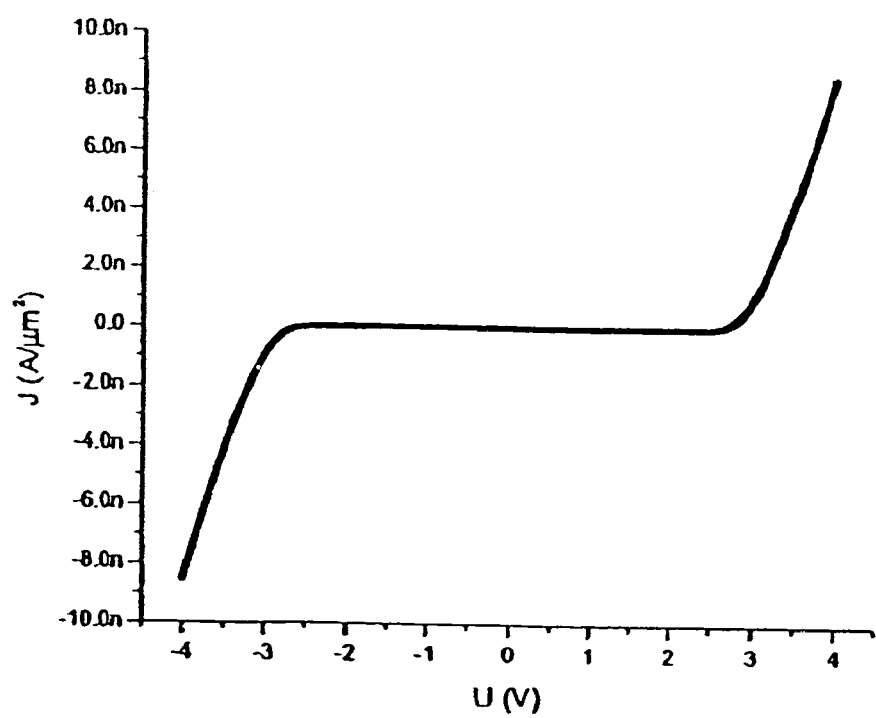
Figure 14A:
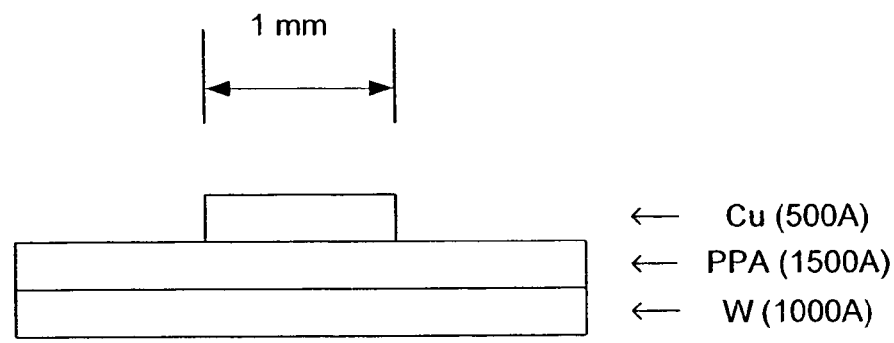
Figure 14B:
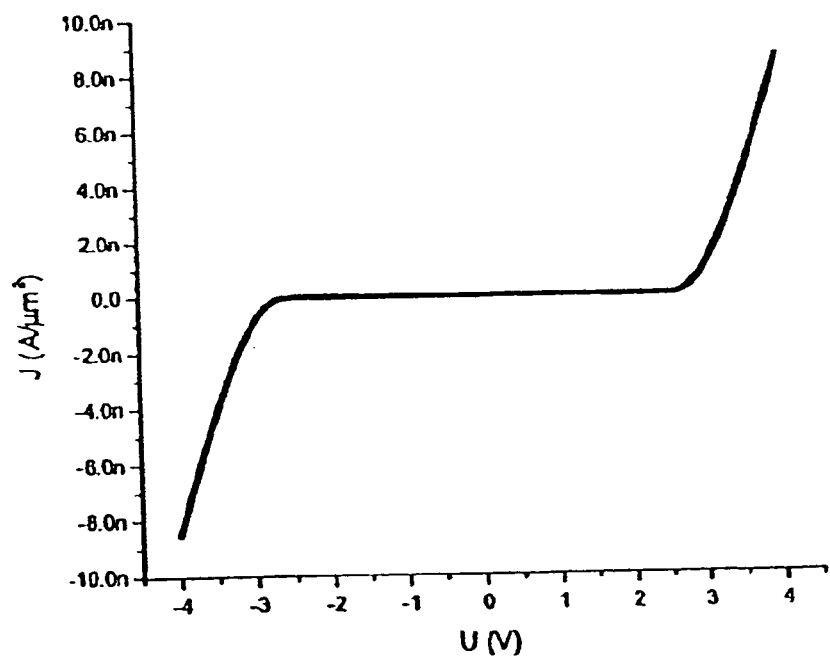

FIG. 8(A) shows, in schematic, simplified cross-sectional view, a diode having a single, relatively thick (1,500 Å) layer of a p-type organic semiconductor material (CuPc) sandwiched between a lower electrode of freshly cleaned Ti and an upper electrode of Ag (500 Å). As is evident from the (I)-(V) plot of FIG. 8 (B), such devices advantageously exhibit very sharp Zener breakdown at very low (negative) voltages of about –0.1 to about –0.3 V.

EXAMPLE VI

FIGS. 9(A)–11(A) show, in schematic, simplified cross-sectional view, diodes composed of a 1,500 Å thick layer of polyphenyl acetylene (PPA) sandwiched between a 500 Å thick Cu lower electrode and 1 mm diameter, 500 Å thick upper electrodes of Al, Ag, and Cu, respectively. Each of the respective (I)-(V) plots shown in FIGS. 9(B)–11(B) is generally symmetrical, with each diode exhibiting relatively low and sharp Zener threshold voltages $V_{zt} \sim 3V$.

EXAMPLE VII

FIGS. 12(A)–14(A) show, in schematic, simplified cross-sectional view, diodes composed of a 1,500 Å thick layer of polyphenylacetylene (PPA) sandwiched between a 1,000 Å thick W lower electrode and 1 mm diameter, 500 Å thick upper electrodes of Al, Ag, and Cu, respectively. Each of the respective (I)-(V) plots shown in FIGS. 12(B)–14(B) are symmetrical, with each diode exhibiting relatively low and sharp Zener threshold voltages $V_{zt} \sim 3V$.

The above-described illustrative, but non-limitative, examples of organic thin film Zener diode structures according to the present invention reflect the extreme flexibility and versatility afforded by the inventive methodology with respect to tailoring ("tuning") the operating characteristics, e.g., Zener threshold voltage $V_{zt}$, of Zener diodes for use in particular applications. Accordingly, the inventive thin film organic Zener diodes, with Zener threshold voltages considerably lower than those of conventional Si-based Zener diodes, are well suited for use in memory device protection circuitry. Moreover, the inventive organic thin film Zener diodes are readily fabricated in cost-effective manner via conventional manufacturing methodologies.

In the previous description, numerous specific details are set forth, such as specific materials, structures, processes, etc., in order to provide a better understanding of the present invention. However, the present invention can be practiced without resorting to the details specifically set forth. In other instances, well-known processing materials, structures, and techniques have not been described in detail in order not to unnecessarily obscure the present invention.

Only the preferred embodiments of the present invention and but a few examples of its versatility are shown and described in the present invention. It is to be understood that the present invention is capable of use in various other embodiments and is susceptible of changes and/or modifications within the scope of the inventive concept as expressed herein.

What is claimed is:

1. A thin film Zener diode, comprising:
    (a) a thin film comprised of at least one layer including at least one organic material; and
    (b) first and second electrodes in contact with respective opposite sides of the thin film; wherein the second electrode has a thickness of about 500 Å or more and about 1000 Å or less and a diameter of about 0.25 mm or more and about 1 mm or less.

2. The diode as in claim 1, wherein:
    the thin film comprises at least one organic material selected from monomers, oligomers, polymers, and combinations thereof, or the thin film comprises metal-containing particles or clusters in an organic polymer matrix or binder.

3. The diode as in claim 1, wherein:
    the thin film comprises one or more layers of at least one p-type organic material; and
    each of the first and second electrodes comprises at least one electrically conductive material having a high work function for electrons equal to or greater than about 4.1 eV.

4. The diode as in claim 3, wherein:
    each of the first and second electrodes comprises at least one electrically conductive material selected from the group consisting of Au, W, Ti, Pt, Ag, Mo, Ta, Cu, metal oxides, and organic polymers.

5. The diode as in claim 3, wherein:
    the first and second electrodes are comprised of the same or different high work function materials.

6. The diode as in claim 1, wherein:
    the thin film comprises one or more layers of at least one n-type organic material; and
    each of the first and second electrodes comprises at least one electrically conductive material having a low work function for electrons less than about 4.1 eV.

7. The diode as in claim 6, wherein:
    each of the first and second electrodes comprises at least one electrically conductive material selected from the group consisting of Ca, Mg, Mg combined with another metal, Al, Al alloys, Li—Al alloys, and metal-dielectric combinations.

8. The diode as in claim 6, wherein:
the first and second electrodes are comprised of the same or different low work function materials.

9. The diode as in claim 1, wherein:
the thin film comprises one or more layers of at least one aromatic amine; and
each of the first and second electrodes comprises at least one electrically conductive material having a high work function for electrons equal to or greater than about 4.1 eV.

10. The diode as in claim 1, wherein:
the thickness of the thin film is between about 10 Å and 1 mm.

11. The diode as in claim 10, wherein:
the thickness of the thin film is between about 10 Å and 1 μm.

12. The diode as in claim 11, wherein:
the thickness of the thin film is between about 10 Å and 1,500 Å.

13. The diode as in claim 1, wherein:
one of the first and second electrodes overlies an electrically insulative substrate.

14. The diode as in claim 1, wherein:
the first electrode is made of Au;
the thin film comprises a layer of perylene tetracarboxylic acid dianhydride (PTCDA) overlying the first electrode and a layer of copper phthalocyanine (CuPc) over the layer of PTCDA; and
the second electrode overlies the layer of CuPc and is made of Ag.

15. The diode as in claim 14, wherein:
the thin film further includes a layer of tetraphenyl biphenylenediamine (TPD) between the CuPc layer and the second electrode.

16. The diode as in claim 1, wherein:
the first electrode is made of Au;
the thin film comprises a layer of copper phthalocyanine (CuPc) overlying the first electrode, a layer of perylene tetracarboxylic acid dianhydride (PTCDA) over the layer of CuPc, and a layer of tetraphenyl biphenylenediamine (TPD) over the layer of PTCDA; and
the second electrode overlies the layer of TPD and is made of Ag.

17. The diode as in claim 1, wherein:
the first electrode is made of Au;
the thin film comprises a layer of copper phthalocyanine (CuPc) overlying the first electrode, and a layer of tetraphenyl biphenylenediamine (TPD) over the layer of CuPc; and
the second electrode overlies the layer of CuPc and is made of Cu.

18. The diode as in claim 1, wherein:
the first electrode is made of Ti;
the thin film comprises a layer of copper phthalocyanine (CuPc) overlying the first electrode; and
the second electrode overlies the layer of CuPc and is made of Ag.

19. The diode as in claim 1, wherein:
the first electrode is made of Cu, Ta, Ti, or W;
the thin film comprises a layer of polyphenylacetylene (PPA) overlying the first electrode; and
the second electrode overlies the layer of PPA and is made of W, Ta, Ti, Al, Ag, or Cu.

* * * * *